(12) United States Patent
Lee

(10) Patent No.: US 9,704,548 B1
(45) Date of Patent: Jul. 11, 2017

(54) SEMICONDUCTOR MEMORY APPARATUS

(71) Applicant: SK hynix Inc., Icheon-si, Gyeonggi-do (KR)

(72) Inventor: Jeong Jun Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/251,053

(22) Filed: Aug. 30, 2016

(30) Foreign Application Priority Data

Feb. 26, 2016 (KR) .......... 10-2016-0023604

(51) Int. Cl.
*G11C 8/00* (2006.01)
*G11C 8/08* (2006.01)
*G11C 8/10* (2006.01)

(52) U.S. Cl.
CPC . *G11C 8/08* (2013.01); *G11C 8/10* (2013.01)

(58) Field of Classification Search
CPC .. G11C 5/063; G11C 7/18; G11C 8/12; G11C 8/10

USPC ........................ 365/230.06, 230.03
See application file for complete search history.

(56) References Cited

U.S. PATENT DOCUMENTS

2013/0114366 A1\* 5/2013 Hosoe .............. G11C 5/02
365/230.06

FOREIGN PATENT DOCUMENTS

KR       1020030091765 A   12/2003
KR         100695288 B1    3/2007

\* cited by examiner

*Primary Examiner* — Son Dinh
(74) *Attorney, Agent, or Firm* — William Park & Associates Ltd.

(57) ABSTRACT

A semiconductor memory apparatus includes a first mat, a second mat, a column driver, and a connection circuit. The first mat may include a first mat column line. The second mat may include a second mat column line. The column driver may drive the first mat column line in response to a mat selection signal and a column decoding signal. The connection circuit may electrically couple or separate the second mat column line to or from the first mat column line in response to the mat select signal.

20 Claims, 3 Drawing Sheets

SEMICONDUCTOR MEMORY APPARATUS

CROSS-REFERENCES TO RELATED APPLICATION

This application claims priority under 35 U.S.C. 119(a) to Korean application No. 10-2016-0023604 filed on Feb. 26, 2016, in the Korean intellectual property Office, which is incorporated by reference in its entirety.

BACKGROUND

1. Technical Field

The inventive concept generally relates to a semiconductor integrated circuit, and more particularly to a semiconductor memory apparatus.

2. Related Art

With the growing use of low-power systems such as portable systems, reduction in power consumption has become more important, and as a large volume of data is being handled in very fast speed, low-power, high-speed, large-capacity semiconductor memories are being developed.

To meet the demands of high-speed devices, the semiconductor memories may be configured to operate at a high clock frequency. To meet the demands of large-capacity memories, some semiconductor memories are implemented as three-dimensional integrated circuits. To meet the demands of low-power devices, the semiconductor memories may be configured to operate using low operating voltages.

In addition, to reduce power consumption, it is important to reduce power consumption at internal circuits of the semiconductor memories.

SUMMARY

According to an embodiment, there is provided a semiconductor memory apparatus. The semiconductor memory apparatus may include a first mat, a second mat, a column driver, and a connection circuit. The first mat may include a first mat column line. The second mat may include a second mat column line. The column driver may drive the first mat column line in response to a mat selection signal and a column decoding signal. The connection circuit may electrically couple or separate the second mat column line to or from the first mat column line in response to the mat select signal.

According to an embodiment, there is provided a semiconductor memory apparatus. The semiconductor memory apparatus may include a first mat, a second mat, a connection circuit, and a column driver. The first mat may include a first mat column line. The second mat may include a second mat column line. The connection circuit may electrically couple or separate the second mat column line to or from the first mat column line in response to a row address. The column driver may drive the first mat column line in response to a column address and the row address.

According to an embodiment, there is provided a semiconductor memory apparatus. The semiconductor memory apparatus may include a column driver, a first mat, a second mat, and a connection circuit. The column driver may be coupled to a first mat column line. The first mat may include the first mat column line. The second mat may include a second mat column line. The connection circuit may coupled between the first mat and the second mat and electrically couple or separate the second mat column line to or from the first mat column line in response to a mat select signal.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
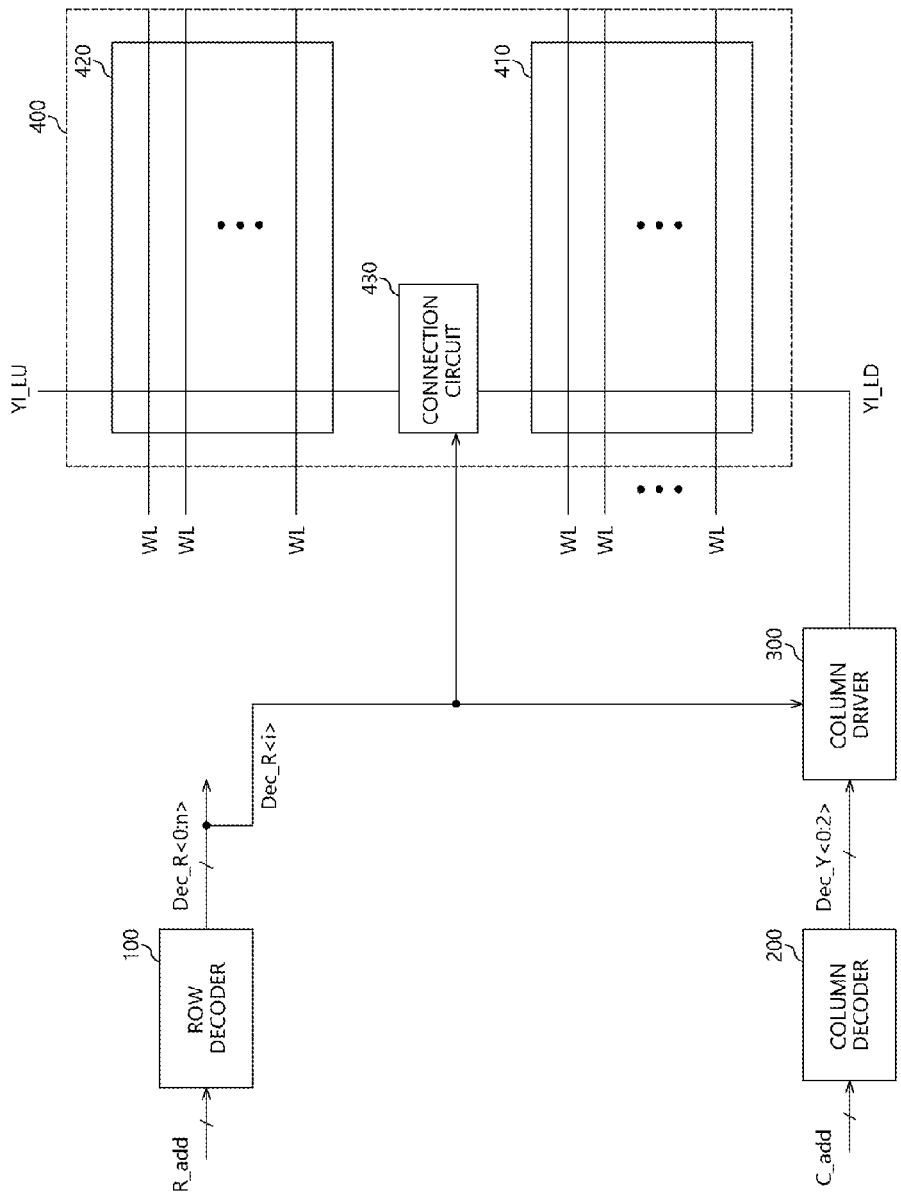
FIG. 1 is a diagram illustrating an example of a semiconductor memory apparatus according to an embodiment of the inventive concept.

Hereinafter, exemplary embodiments will be described in greater detail with reference to the accompanying drawings. Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

The inventive concept is described herein with reference to cross-section and/or plan illustrations that are schematic illustrations of idealized embodiments of the inventive concept. However, embodiments of the inventive concept should not be limited construed as limited to the inventive concept. Although a few embodiments of the inventive concept will be shown and described, it will be appreciated by those of ordinary skill in the art that changes may be made in these exemplary embodiments without departing from the principles and spirit of the inventive concept.

In FIG. 1, a semiconductor memory apparatus according to an embodiment may include a row decoder 100, a column decoder 200, a column driver 300, and a data storage region 400.

The row decoder 100 may generate a plurality of row decoding signals Dec_R<0:n> in response to a row address R_add. For example, the row decoder 100 may selectively enable the plurality of row decoding signals Dec_R<0:n> by decoding the row address R_add. One of the plurality of row decoding signals Dec_R<0:n> may include a signal that is used to select one of a first mat 410 and a second mat 420. For example, if a column driver (e.g., the column driver 300) is assigned to the first and second mats 410 and 420, the first mat 410 may be a mat that is placed closer to column driver than the second mat 420. The row decoding signal Dec_R<i>, which is used to select one of the first mat 410 and the second mat 420, may be referred to as a mat select signal Dec_R<i>. The first mat 410 may be a down mat. The second mat 420 may be an up mat.

The column decoder 200 may generate a plurality of column decoding signals Dec_Y<0:2> in response to a column address C_add. For example, the column decoder 200 may selectively enable the plurality of column decoding signals Dec_Y<0:2> by decoding the column address C_add.

The column driver 300 may drive a first mat column line YI_LD in response to the plurality of column decoding signals Dec_Y<0:2> and the mat select signal Dec_R<i>. For example, the column driver 300 may drive the first mat column line YI_LD in response to the plurality of column decoding signals Dec_Y<0:2> and determine a driving force for driving the first mat column line YI_LD in response to the mat select signal Dec_R<i>. For example, when the mat select signal Dec_R<i> is enabled, the column driver 300 may drive the first mat column line YI_LD with a driving force larger than the driving force used when the mat select signal Dec_R<i> is disabled.

The data storage region 400 may include the first mat 410, the second mat 420, and a connection circuit 430.

The first mat 410 and the second mat 420 may include a plurality of word lines WL that may be selectively activated in response to the plurality of row decoding signals Dec_R<0:n>. The first mat 410 may include the first mat column line YI_LD, and the second mat 420 may include a second mat column line YI_LU. When the first mat 410 is accessed, a memory cell arranged where an enabled word line WL and a driven first mat column line YI_LD meet may be accessed. Likewise, when the second mat 420 is accessed, a memory cell arranged where the enabled word line WL and a driven second mat column line YI_LU meet may be accessed. The plurality of word lines WL included in the first mat 410 and the second mat 420 may be selectively enabled in response to the plurality of row decoding signals Dec_R<0:n>.

The connection circuit 430 may electrically couple or separate the first mat column line YI_LD and the second mat column line YI_LU in response to the mat select signal Dec_R<i>. For example, the connection circuit 430 may couple the first mat column line YI_LD and the second mat column line YI_LU when the mat select signal Dec_R<i> is enabled, and may separate the first mat column line YI_LD and the second mat column line YI_LU from one another when the mat select signal Dec_R<i> is disabled. The connection circuit 430 may include a switch or a pass gate.

Figure 2:
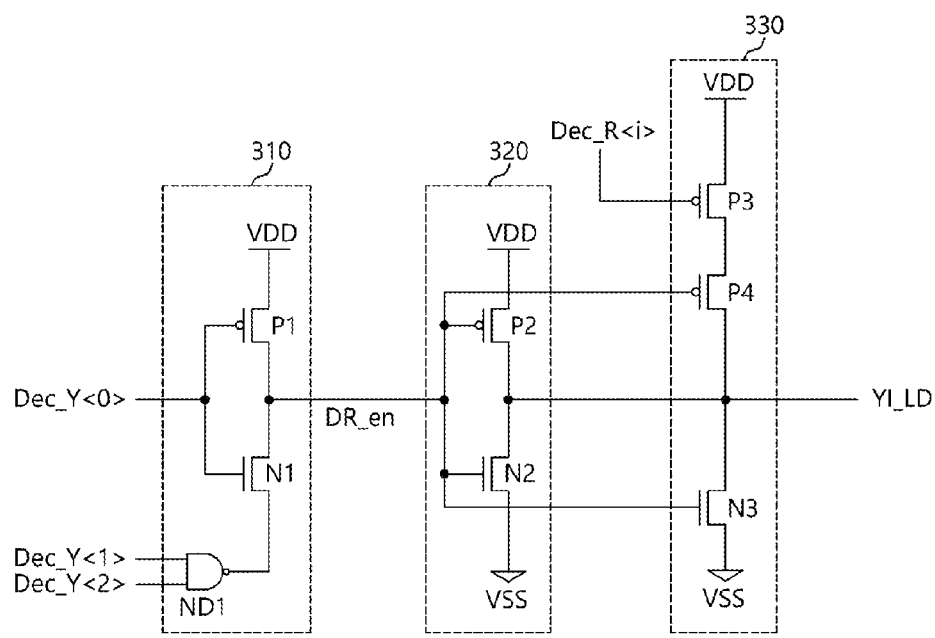
FIG. 2 is a diagram illustrating an example of a column driver of FIG. 1.

In FIG. 2, the column driver 300 may include a driver activation determination circuit 310, a fixed driver 320, and a variable driver 330.

The driver activation determination circuit 310 may generate a driving enable signal DR_en in response to the plurality of column decoding signals Dec_Y<0:2>. The plurality of column decoding signals Dec_Y<0:2> may include first to third column decoding signals Dec_Y<0>, Dec_Y<1>, and Dec_Y<2>. For example, the driver activation determination circuit 310 may enable the driving enable signal DR_en when all the first to third column decoding signals Dec_Y<0>, Dec_Y<1>, and Dec_Y<2> are enabled. The driver activation determination circuit 310 may disable the driving enable signal DR_en when any one of the first to third column decoding signals Dec_Y<0>, Dec_Y<1>, and Dec_Y<2> is disabled.

The driver activation determination circuit 310 may include an NAND gate ND1 and first and second transistors P1 and N1. The NAND gate ND1 may receive the second and third column decoding signals Dec_Y<1> and Dec_Y<2>. A gate of the first transistor P1 may receive the first column decoding signal Dec_Y<0>, and a source of the first transistor P1 may receive an external voltage VDD. A gate of the second transistor N1 may receive the first column decoding signal Dec_Y<0>, a drain of the second transistor N1 may be coupled to a drain of the first transistor P1, and a source of the second transistor N1 may be coupled to an output terminal of the NAND gate ND1. The driving enable signal DR_en may be output from a node that is coupled to the drains of the first and second transistors P1 and N1.

An operation of the driver activation determination circuit 310 in accordance with an embodiment will be described below. When both the second and third column decoding signals Dec_Y<1> and Dec_Y<2> are enabled to a logic high level and the NAND gate ND1 outputs a logic low signal, the driver activation determination circuit 310 may generate the driving enable signal DR_en in response to the first column decoding signal Dec_Y<0>. More specifically, when both the second and third column decoding signals Dec_Y<1> and Dec_Y<2> are enabled to a logic high level, the NAND gate ND1 may outputs the logic low signal, and if the first column decoding signal Dec_Y<0> is enabled to a logic high level, the driver activation determination circuit 310 may output a logic low signal as the driving enable signal DR_en. When both the second and third column decoding signals Dec_Y<1> and Dec_Y<2> are enabled to a logic high level, the NAND gate ND1 may output the logic low signal, and if the first column decoding signal Dec_Y<0> is disabled to a logic low level, the driver activation determination circuit 310 may disable the driving enable signal DR_en to a logic high level.

The fixed driver 320 may drive the first mat column line YI_LD to a voltage level of the external voltage VDD when the driving enable signal DR_en is enabled. For example, when the driving enable signal DR_en is enabled to a low level, the fixed driver 320 may drive the first mat column line YI_LD to the voltage level of the external voltage VDD.

The fixed driver 320 may include third and fourth transistors P2 and N2. A gate of the third transistor P2 may receive the driving enable signal DR_en and a source of the third transistor P2 may receive the external voltage VDD. A gate of the fourth transistor N2 may receive the driving enable signal DR_en, a drain of the fourth transistor N2 may be coupled to a drain of the third transistor P2, and a source of the fourth transistor N2 may be coupled to a ground terminal VSS. The first mat column line YI_LD may be coupled to a node that is coupled to the drains of the third and fourth transistor P2 and N2.

The variable driver 330 may drive the first mat column line YI_LD to the voltage level of the external voltage VDD in response to the mat select signal Dec_R<i> and the driving enable signal DR_en. For example, the variable driver 330 may drive the first mat column line YI_LD to the voltage level of the external voltage VDD when both the mat select signal Dec_R<i> and the driving enable signal DR_en are enabled. The variable driver 330 may not drive the first mat column line YI_LD when any one of the mat select signal Dec_R<i> and the driving enable signal DR_en is disabled.

The variable driver 330 may include fifth to seventh transistors P3, P4, and N3. A gate of the fifth transistor P3 may receive the mat select signal Dec_R<i>, and a source of the fifth transistor P3 may receive the external voltage VDD. A gate of sixth transistor P4 may receive the driving enable signal DR_en, a source of the sixth transistor P4 may be coupled to a drain of the fifth transistor P3, and a drain of the sixth transistor P4 may be coupled to the first mat column line YI_LD. A gate of the seventh transistor N3 may receive the driving enable signal DR_en, a drain of the seventh transistor N3 may be coupled to the first mat column line YI_LD, and a source of the seventh transistor N3 may be coupled to the ground terminal VSS.

Referring back to FIG. 1, the connection circuit 430 may electrically couple or separate the first mat column line YI_LD and the second mat column line YI_LU in response to the mat select signal Dec_R<i>. The connection circuit 430 may initialize the second mat column line YI_LU in response to the mat select signal Dec_R<i>. That is, the connection circuit 430 may lower the second mat column line YI_LU to a voltage level of the ground voltage VSS in response to the mat select signal Dec_R<i>. For example, the connection circuit 430 may couple the first mat column line YI_LD to the second mat column line YI_LU when the mat select signal Dec_R<i> is enabled. The connection circuit 430 may separate the first mat column line YI_LD from the second mat column line YI_LU and initialize the second mat column line YI_LU when the mat select signal Dec_R<i> is disabled.

Figure 3:
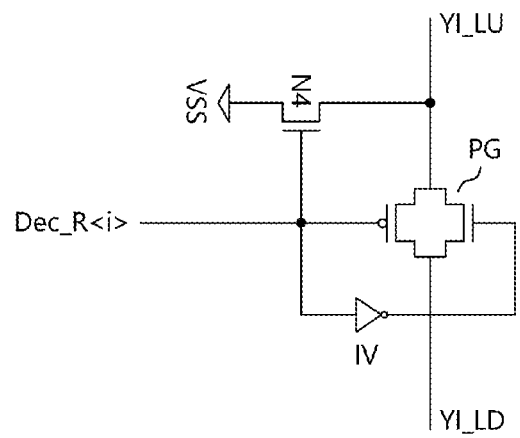
FIG. 3 is a diagram illustrating an example of a connection circuit of FIG. 1.

In FIG. 3, the connection circuit 430 may include an inverter IV, an eighth transistor N4, and a pass gate PG. An input terminal of the inverter IV may receive the mat select signal Dec_R<i>. An input terminal and an output terminal of the pass gate PG may be coupled to the first mat column line YI_LD and the second mat column line YI_LU. A first control terminal of the pass gate PG may receive the mat select signal Dec_R<i>, and a second control terminal of the pass gate PG may receive an output signal of the inverter IV. A gate of the eighth transistor N4 may receive the mat select signal Dec_R<i>, a drain of the eighth transistor N4 may be coupled to the second mat column line YI_LU, and a source of the eighth transistor N4 may be coupled to the ground terminal VSS.

The semiconductor memory apparatus in accordance with an embodiment will be described below.

The row address R_add and the column address C_add may be input to the semiconductor memory apparatus.

The row address R_add may be input to the row decoder 100.

The row decoder 100 may generate the plurality of row decoding signals Dec_R<0:n> by decoding the row address R_add. The plurality of row decoding signals Dec_R<0:n> may selectively enable word lines included in the first mat 410 and the second mat 420. For example, it is assumed that four word lines are arranged in each of the first mat 410 and the second mat 420, and the plurality of row decoding signals Dec_R<0:n> include the first to third row decoding signals Dec_R<0:2>.

TABLE

| First word line (second mat) | Dec_R<0:2>: 0,0,0 |
| Second word line (second mat) | Dec_R<0:2>: 0,0,1 |
| Third word line (second mat) | Dec_R<0:2>: 0,1,0 |
| Fourth word line (second mat) | Dec_R<0:2>: 0,1,1 |
| Fifth word line (first mat) | Dec_R<0:2>: 1,0,0 |
| Sixth word line (first mat) | Dec_R<0:2>: 1,0,1 |
| Seventh word line (first mat) | Dec_R<0:2>: 1,1,0 |
| Eighth word line (first mat) | Dec_R<0:2>: 1,1,1 |

As shown in the table above, the first to eighth word lines WL may be selected by the first to third row decoding signals Dec_R<0:2>. In an embodiment, the first row decoding signal Dec_R<0> may be used to select between a word line of the first mat 410 and a word line of the second mat 420. Accordingly, the first row decoding signal Dec_R<0> may be used as the mat select signal Dec_R<i>.

Referring to FIG. 1, the column address C_add may be input to the column decoder 200.

The column decoder 200 may generate the plurality of column decoding signals Dec_Y<0:2> by decoding the column address C_add. For example, the plurality of column decoding signals Dec_Y<0:n> may include the first to third column decoding signals Dec_Y<0:2>.

The column driver 300 may drive the first mat column line YI_DL to the voltage level of the external voltage VDD only when all the first to third column decoding signals Dec_Y<0:2> are enabled. The column driver 300 may determine a driving force for driving the first mat column line YI_LD in response to the mat select signal Dec_R<i>. When the mat select signal Dec_R<i> (Dec_R<0> in Table) is enabled, the column driver 300 may drive the first mat column line YI_LD with a driving force larger than the driving force used when the mat select signal Dec_R<i> is disabled. Referring to FIG. 2, the column driver 300 may include the driver activation determination circuit 310, the fixed driver 320, and the variable driver 330. The driver activation determination circuit 310 may enable the driving enable signal DR_en to a logic low level when all the first to third column decoding signals Dec_Y<0:2> are enabled to a logic high level. When the driving enable signal DR_en is enabled to a logic low level, the fixed driver 320 may drive the first mat column line YI_LD to the voltage level of the external voltage VDD. Even when the driving enable signal DR_en is enabled, the variable driver 330 may not drive the first mat column line YI_LD if the mat select signal Dec_R<i> is not enabled. Only when both the driving enable signal DR_en and the mat select signal Dec_R<i> are enabled, the variable driver 330 may drive the first mat column line YI_LD.

Referring to FIG. 1, the connection circuit 430 may electrically couple or separate the first mat column line YI_LD to or from the second mat column line YI_LU in response to the mat select signal Dec_R<i>. For example, the connection circuit 430 may couple the first mat column line YI_LD to the second mat column line YI_LU only when the mat select signal Dec_R<i> is enabled to a logic low level. When the mat select signal Dec_R<i> is disabled to a logic high level, the connection circuit 430 may electrically separate the first mat column line YI_LD from the second mat column line YI_LU.

The operation of the semiconductor memory apparatus according to an embodiment will be summarized below.

Whether to select a word line included in the first mat 410 or a word line included in the second mat 420 may be determined depending on the row address R_add (e.g., Dec_R<i> among the plurality of row decoding signals Dec_R<0:n>). Here, the row decoding signal Dec_R<i> may be referred to as the mat select signal Dec_R<i> because it may be defined that the mat is activated when a word line included in the mat is enabled.

When the plurality of column decoding signals Dec_Y<0:2> generated in the column decoder 200 is input to the column driver 300 and all the column decoding signals Dec_Y<0:2> are enabled, the column driver 300 may drive the first mat column line YI_LD to the voltage level of the external voltage VDD. The column driver 300 may determine a driving force in response to the mat select signal Dec_R<i> when the first mat column line YI_LD is driven. For example, when the second mat 420 is activated (i.e., at least one of the word lines included in the second mat 420 is activated), the column driver 300 may drive the first mat column line YI_LD with a driving force larger than the driving force used when the mat select signal Dec_R<i> is disabled (i.e., when only the first mat 410 is activated.

The connection circuit 430 may electrically couple or separate the first mat column line YI_LD to or from the second mat column line YI_LU in response to the mat select signal Dec_R<i>.

When the mat select signal Dec_R<i> is enabled and the second mat 420 is activated, the connection circuit 430 may couple the first mat column line YI_LD to the second mat column line YI_LU, and the column driver 300 may drive the first mat column line YI_LD with a driving force larger than the driving force used when the mat select signal Dec_R<i> is disabled. Accordingly, the second mat column line YI_LU may be driven by the larger driving force the first mat column line YI_LD driven with. The column driver 300 may drive the first mat column line YI_LD through both the fixed driver 320 and the variable driver 330.

When the mat select signal Dec_R<i> is disabled and the first mat 410 is activated, the connection circuit 430 may separate the first mat column line YI_LD from the second mat column line YI_LU, and the column driver 300 may drive the first mat column line YI_LD with a relatively small driving force that is smaller than the driving force used when the mat select signal Dec_R<i> is enabled. Accordingly, the second mat column line YI_LU may be separated from the first mat column line YI_LD and may not be driven, and only the first mat column line YI_LD may be driven. The column driver 300 may drive the first mat column line YI_LD only through the fixed driver 320 without using the variable driver 330.

The semiconductor memory apparatus according to an embodiment may electrically couple or separate a column line of a second mat to or from a column line of a first mat according to whether the second mat is activated or the first mat is activated, through a connection circuit coupled to both the second mat and the first mat. When the second mat is activated (when the column line of the second mat is supposed to be driven), the semiconductor memory apparatus may drive the column lines through two drivers (the fixed driver and the variable driver). The semiconductor memory apparatus may drive the column line through one driver (the fixed driver) when only the column line of the first mat is driven. To put it another way, the fixed driver may drive the first mat column line whenever one of the first and second mats is activated, and the variable driver may drive the first mat column line coupled to the second mat column line when the second mat is activated. Accordingly, since the driving force that the column line is driven with may be determined according to a length of the column line to be driven, the power consumption of the semiconductor memory apparatus may be managed.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A semiconductor memory apparatus comprising:
   a first mat including a first mat column line;
   a second mat including a second mat column line;
   a column driver configured to drive the first mat column line in response to a mat select signal and a column decoding signal; and
   a connection circuit configured to electrically couple the second mat column line to the first mat column line when the mat select signal is enabled and configured to electrically separate the second mat column line from the first mat column line when the mat select signal is disabled.

2. The semiconductor memory apparatus of claim 1, further comprising:
   a row decoder configured to generate row decoding signals by decoding a row address; and
   a column decoder configured to generate the column decoding signal by decoding a column address.

3. The semiconductor memory apparatus of claim 2, wherein the mat select signal is one of the row decoding signals.

4. The semiconductor memory apparatus of claim 1, wherein the mat select signal is a signal for activating one of the second mat and the first mat, and the second mat is activated when the mat select signal is enabled, and the first mat is activated when the mat select signal is disabled.

5. The semiconductor memory apparatus of claim 4, wherein the column driver drives the first mat column line in response to the column decoding signal, and determine a driving force for driving the first mat column line in response to the mat select signal.

6. The semiconductor memory apparatus of claim 5, wherein, when the mat select signal is enabled, the column driver drives the first mat column line with a driving force larger than the driving force used when the mat select signal is disabled.

7. The semiconductor memory apparatus of claim 6, wherein the column driver includes:
   a driver activation determination circuit configured to generate a driving enable signal in response to the column decoding signal;
   a fixed driver configured to drive the first mat column line in response to the driving enable signal; and
   a variable driver configured to drive the first mat column line in response to the driving enable signal and the mat select signal.

8. The semiconductor memory apparatus of claim 7, wherein the fixed driver drives the first mat column line when the driving enable signal is enabled, and the variable driver drives the first mat column line when both the driving enable signal and the mat select signal are enabled.

9. The semiconductor memory apparatus of claim 1, wherein the connection circuit electrically couples the second mat column line to the first mat column line when the mat select signal is enabled, and electrically separates the second mat column line from the first mat column line when the mat select signal is disabled.

10. The semiconductor memory apparatus of claim 9, wherein the first mat column line and the second mat column line are driven through the column driver when the first mat column line and the second mat column line are coupled to each other.

11. The semiconductor memory apparatus of claim 9, wherein the connection circuit initializes the second mat column line when the mat select signal is disabled.

12. A semiconductor memory apparatus comprising:
   a first mat including a first mat column line;
   a second mat including a second mat column line;
   a connection circuit configured to electrically couple or separate the second mat column line to or from the first mat column line in response to a row address; and a column driver configured to drive the first mat column line in response to a column address and the row address, wherein the first mat column line transfers a signal to the first mat and the second mat column line transfers a signal to the second mat, wherein the connection circuit controls a length of a signal transferal in response to the row address.

13. The semiconductor memory apparatus of claim 12, further comprising:

a row decoder configured to generate row decoding signals by decoding the row address; and a column decoder configured to generate a column decoding signal by decoding the column address.

14. The semiconductor memory apparatus of claim 13, wherein the connection circuit electrically couples or separates the second mat column line to or from the first mat column line in response to one of the row decoding signals.

15. The semiconductor memory apparatus of claim 14, wherein the column driver drives the first mat column line in response to the column decoding signal and the row decoding signal input to the connection circuit.

16. The semiconductor memory apparatus of claim 15, wherein the column driver is configured to determine a driving force for driving the first mat column line in response to the row decoding signal input to the connection circuit.

17. The semiconductor memory apparatus of claim 16, wherein the column driver includes:

a driver activation determination circuit configured to generate a driving enable signal in response to the column decoding signal;

a fixed driver configured to drive the first mat column line in response to the driving enable signal; and a variable driver configured to drive the first mat column line in response to the row decoding signal input to the connection circuit and the driving enable signal.

18. A semiconductor memory apparatus comprising:

a column driver coupled to a first mat column line;

a first mat including the first mat column line;

a second mat including a second mat column line; and a connection circuit coupled between the first mat and the second mat and configured to electrically couple the second mat column line to the first mat column line when the mat select signal is enabled and configured to electrically separate the second mat column line from the first mat column line when the mat select signal is disabled.

19. The semiconductor memory apparatus of claim 18, wherein the column driver includes:

a fixed driver configured to drive the first mat column line whenever one of the first and second mats is activated; and a variable driver configured to drive the first mat column line coupled to the second mat column line when the second mat is activated.

20. The semiconductor memory apparatus of claim 18, wherein the connection circuit includes a pass gate coupled between the first mat column line and the second mat column line, the pass gate coupling the first mat column line to the second mat column line in response to the mat select signal.

* * * * *